United States Patent
Hagerty

(10) Patent No.: US 7,405,559 B1
(45) Date of Patent: Jul. 29, 2008

(54) LOW-POWER GIANT MAGNETO-IMPEDANCE MAGNETIC DETECTOR THAT UTILIZES A CRYSTAL CONTROLLED OSCILLATOR

(75) Inventor: James D. Hagerty, Tiverton, RI (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 277 days.

(21) Appl. No.: 11/473,419

(22) Filed: Jun. 26, 2006

(51) Int. Cl.
*G01R 33/04* (2006.01)
(52) U.S. Cl. ....................... 324/249; 324/260
(58) Field of Classification Search .......... 324/244–260
See application file for complete search history.

(56) References Cited

U.S. PATENT DOCUMENTS

| | | | |
|---|---|---|---|
| 5,764,055 A | 6/1998 | Kawase | |
| 5,831,432 A | 11/1998 | Mohri | |
| 6,229,307 B1 | 5/2001 | Umehara et al. | |
| 6,433,533 B1 | 8/2002 | Clymer et al. | |
| 6,747,449 B1 | 6/2004 | Maylin et al. | |
| 6,897,649 B2 | 5/2005 | Kawase | |
| 6,909,368 B2 | 6/2005 | Simi et al. | |

*Primary Examiner*—Jay M Patidar
(74) *Attorney, Agent, or Firm*—James M. Kasischke; Jean-Paul A. Nasser; Michael P. Stanley

(57) ABSTRACT

The present invention is an electrical circuit for a sensor designed to detect external magnetic fields. The circuit is composed of a stable voltage reference source, connected to a low frequency amplifier where the operating point of the amplifier depends on the voltage reference source that is biased for maximum allowable voltage swings of the amplifier. A GMI fiber is connected to the low frequency amplifier and to a crystal oscillator that generates a square wave excitation signal with which to excite the GMI fiber. A decoupling network connected to the amplifier allows stable excitation of the GMI fiber by separating the direct current paths of the amplifier from the excitation signal. When the GMI fiber is excited by the square wave signal the GMI fiber impedance varies with impressed magnetic fields, which in turn varies the output voltage of the amplifier.

7 Claims, 1 Drawing Sheet

LOW-POWER GIANT MAGNETO-IMPEDANCE MAGNETIC DETECTOR THAT UTILIZES A CRYSTAL CONTROLLED OSCILLATOR

STATEMENT OF GOVERNMENT INTEREST

The invention described herein may be manufactured and used by or for the Government of the United States of America for governmental purposes without the payment of any royalties thereon or therefore.

BACKGROUND OF THE INVENTION (1) Field of the Invention

The present invention is directed to sensors, and more specifically to an electronic sensor which detects and measures external magnetic fields.

(2) Description of the Prior Art

The emergence of practical sensors using the giant magneto-impedance (GMI) effect has become well known. Tiny fibers smaller than a human hair that are made from a chemical composite such as cobalt, iron, silicon and boron exhibit the GMI property of a changing impedance under the influence of an external magnetic field when the fiber is excited by a radio-frequency signal. Amorphous cobalt-rich ribbons, wires, and glass covered micro-wires are good candidates for GMI applications.

Sensors that detect magnetic fields using GMI fibers can detect and record the magnetic characteristics of a small marine craft using a GMI fiber as small as a few millimeters. Current designs for such sensors typically utilize the reactance or even the resistive portion of the dynamic impedance of such fibers as the frequency-determining elements of an oscillator. One difficulty arises when, at very high resonant frequencies, the oscillator drift assumes a magnitude that is significant with respect to the frequency change that is being measured to detect the magnetic field. What is needed is a sensor that detects magnetic fields using GMI fibers that is not affected by oscillator drifts.

SUMMARY OF THE INVENTION

It is a general purpose and object of the present invention to detect external magnetic fields with a sensor that employs a GMI fiber in an electronic circuit.

It is a further object of this invention to avoid the effect of oscillator drifts with a sensor that employs a GMI fiber in an electronic circuit.

The above objects are achieved with the present invention by an electrical circuit composed of six parts. The first part is a stable voltage reference source. The second part is a low frequency amplifier joined to the voltage reference source. The-operating point of the amplifier depends on the voltage reference source that is biased for maximum allowable voltage swings of the amplifier. The third part of the circuit is a GMI fiber that connects to the low frequency amplifier, and a biasing coil. The GMI fiber impedance varies with impressed magnetic fields when the fiber is excited by radio frequency signal, which in turn varies the output voltage of the amplifier. The bias coil increases the sensitivity of the GMI fiber by fixing an operating point for the fiber. The fourth part is a crystal oscillator connected to a resistor and a capacitor. The oscillator generates a square wave excitation signal with which to excite the GMI fiber. The fifth part is a decoupling network comprising an inductor and capacitor that allows stable excitation of the GMI fiber by separating the direct current paths of the amplifier from the radio frequency excitation signal. Finally the sixth part of the circuit is an analog to digital converter which receives the output voltage from the amplifier.

BRIEF DESCRIPTION OF THE DRAWINGS

A more complete understanding of the invention and many of the attendant advantages thereto will be readily appreciated as the same becomes better understood by reference to the following detailed description when considered in conjunction with the accompanying drawings, wherein like reference numerals refer to like parts and wherein.

DETAILED DESCRIPTION

Figure 1:
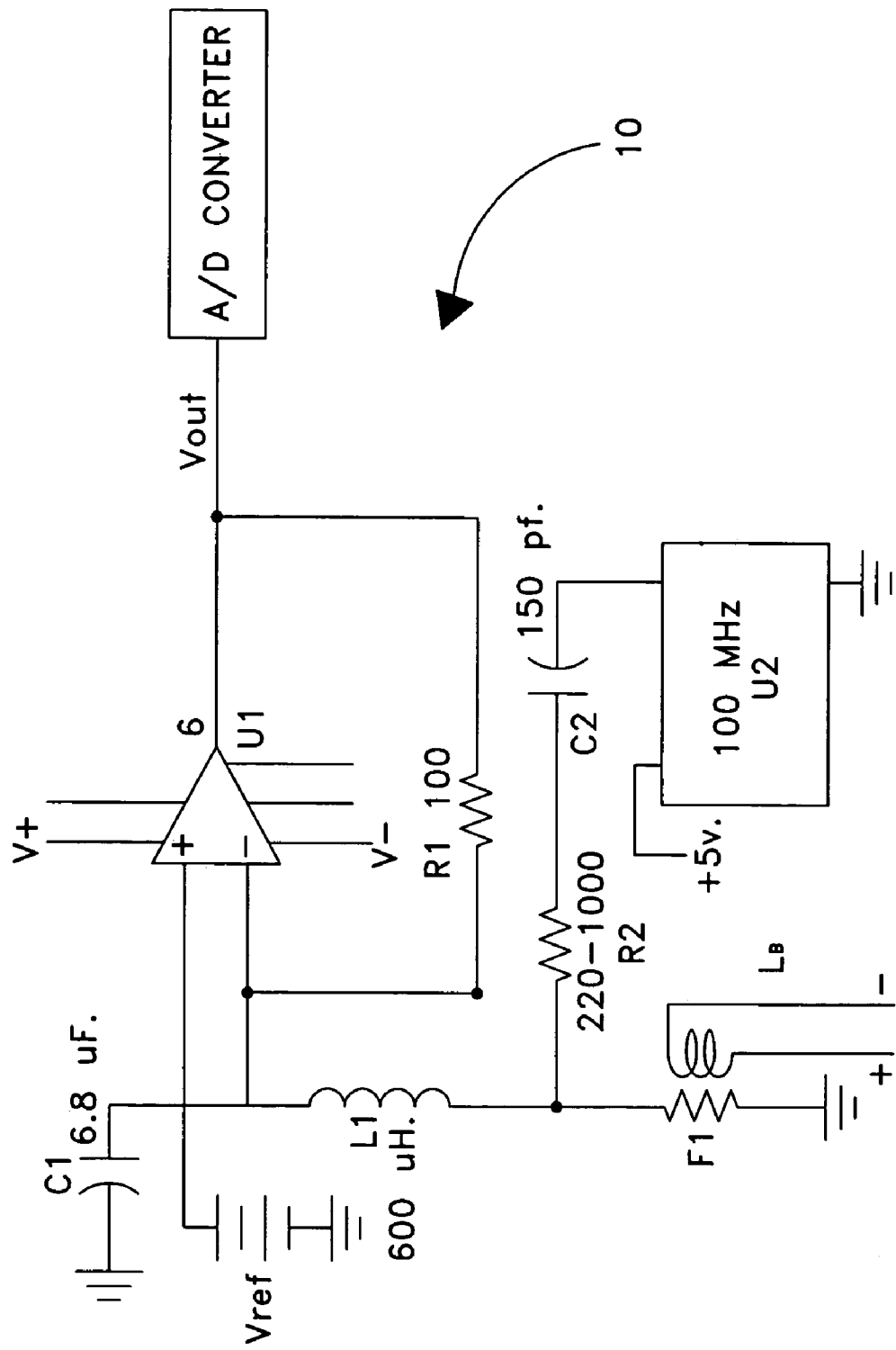
FIG. 1 is an illustration of the circuit diagram for the sensor of the present invention.

Referring to FIG. 1, there is shown a circuit diagram of circuit 10 representing an embodiment of the present invention. The circuit 10 is designed to detect magnetic fields and provide a converted analog output in either the X, Y, or Z Cartesian direction, depending upon the orientation of the circuit components. The circuit 10 is composed of six functional parts. The first part is a stable voltage reference source Vref. A suitable choice for this component would be the Texas Instruments TPS 79000 family of regulators, available in 1.8 and 3.3 volt fixed output voltages. However, the invention is not limited to this particular component.

The second part of the circuit 10 is a very low frequency amplifier U1 such as a rail to rail operational amplifier connected in series with a resistor R1. A rail-to-rail device with a high supply voltage rating and dynamic range is recommended. The voltage reference source Vref is connected to the input of amplifier U1. The operating point of the amplifier U1 depends on the voltage reference source Vref that is biased for maximum allowable dynamic range output voltage swings of the amplifier U1 for the range of magnetic fields to be measured. The voltage reference Vref sets a highly stable operating point for the amplifier U1 when no external magnetic, field is applied to the circuit 10.

The third part of the circuit 10 is a GMI fiber F1 that connects to the low frequency amplifier U1 input, and a magnetic bias coil LB. that is wrapped around the GMI fiber F1. The GMI fiber F1 impedance varies with impressed magnetic fields when the fiber F1 is simultaneously excited by radio frequency signals. The varying impedance of the GMI fiber F1 in turn varies the output voltage of the amplifier U1. The bias coil $L_B$ increases the sensitivity of the GMI fiber F1 by fixing an operating point for the fiber F1 itself for best magnetic sensitivity. The bias coil $L_B$ is used to shift the magnetic operating point of the GMI fiber F1 so that the "delta-impedance per applied magnetic field" curve is at its greatest slope, indicating the highest sensitivity.

The fourth part of the circuit 10 is a crystal oscillator U2 connected in series to a resistor R2 and a capacitor C2. The oscillator U2 generates a square wave excitation signal with which to excite the GMI fiber F1 in order to make it sensitive to external magnetic fields. In a preferred embodiment, a suitable component for the oscillator U2 would be the module manufactured by International Crystal Corp (IT1100FSS). It provides a crystal controlled 0 to 5 volt square wave that is many times more stable than a discrete inductor capacitor (L-C) oscillator. However, the invention is not limited to the use of such oscillator.

The voltage output $V_{out}$ of the amplifier U1 with no applied magnetic field is expressed as:

$$Vref*(gain) \quad (1)$$

where Vref represents the voltage in volts of the voltage reference Vref, and the gain is calculated according to the equation:

$$1+(R1/\text{direct current GMI fiber F1 resistance}) \quad (2)$$

where R1 is the resistance in Ohms of the resistor R1. R1 is a feedback resistor, which helps to set the gain in the non-inverting feed back amplifier U1. The measured direct current resistance of a ½ inch section of a typical piece of GMI fiber F1 is 39 Ohms, taken open-circuit with no excitation.

When a magnetic field is applied, the impedance of the GMI fiber F1 changes. GMI fibers may be synthesized to have a mainly resistive change (or alternatively a reactive change) under an applied magnetic field for a given excitation frequency. When F1's impedance changes, so does the amplifier gain and therefore the direct current output voltage $V_{out}$ at pin 6 of the amplifier U1.

The fifth part of the circuit 10 is a decoupling network comprising an inductor L1 and capacitor C1 that allows stable excitation of the GMI fiber F1 by separating the direct current paths of the amplifier U1 from the radio frequency excitation signal. L1 acts as a short circuit of direct current, while cutting off the radio frequency excitation from the amplifier portion of the circuit. Care must be taken so that the GMI fiber F1's impedance does not become capacitive enough to resonate with inductor L1. If this is the case a "damping" resistor may be added in series with the GMI fiber F1 ahead of the resistor R2 junction.

Capacitor C2 has the effect of alternating current (ac) coupling the fiber excitation so that an additional direct current voltage from the oscillator U2 does not build up across the GMI fiber F1. The resistor R2 provides resistive damping so that capacitor C2 and inductor L1 do not resonate. R2 may also be used to bias the correct radio frequency excitation level across the GMI fiber F1. This is typically in the low-milliamp region for root mean square current.

Finally the sixth part of the circuit 10 is an analog to digital converter which receives the analog output voltage from the amplifier U1 and converts it to a digital signal for further processing.

The advantage of the present invention is that the source of radio frequency excitation for the GMI fiber F1 is a highly stable controlled square wave oscillator U2, eliminating the requirement for designing a stable discrete-component (inductor/capacitor) RF oscillator that works in the desired frequency range such as 50-100 MHz. Oscillator drift is not an issue because a crystal is used. The present invention makes it more feasible to excite the GMI fiber F1 at very high frequencies, which will tend to increase its sensitivity to the external magnetic field. The excitation oscillator U2 can operate at frequencies up to 100 MHz.

In addition, since the voltage output is generated by a direct current amplifier U1, an extremely low-bandwidth analog to digital converter (16 or 24 bits) can be used which will keep power consumption down to a minimum. The circuit 10 deliberately avoids digital logic running at high speeds. However, a small, low-power microcontroller may be added to format data or generate the analog to digital control signals.

While it is apparent that the illustrative embodiments of the invention disclosed herein fulfill the objectives of the present invention, it is appreciated that numerous modifications and other embodiments may be devised by those skilled in the art. Additionally, feature(s) and/or element(s) from any embodiment may be used singly or in combination with other embodiment(s). Therefore, it will be understood that the appended claims are intended to cover all such modifications and embodiments, which would come within the spirit and scope of the present invention.

What is claimed is:

1. A sensor electrical circuit comprising:
   a stable voltage reference source;
   a low frequency amplifier joined to the voltage reference source wherein the operating point of the amplifier depends on the voltage reference source that is biased for maximum allowable voltage swings of the amplifier;
   a first resistor connected in series with said low frequency amplifier which helps to set the gain in the low frequency amplifier;
   a GMI fiber that connects to the input of the low frequency amplifier, wherein the GMI fiber impedance varies with impressed magnetic fields when the fiber is excited by a radio frequency signal, which in turn varies an output voltage of the low frequency amplifier;
   a crystal oscillator connected in series to a second resistor and a first capacitor, wherein the crystal oscillator generates a square wave excitation signal with which to excite the GMI fiber, wherein the second resistor provides resistive damping, wherein the first capacitor alternating current couples the fiber excitation so that an additional direct current voltage from the oscillator does not build up across the GMI fiber;
   a decoupling network that allows stable excitation of the GMI fiber by separating the direct current paths of the low-frequency amplifier from the radio frequency excitation signal generated by the crystal oscillator; and
   an analog to digital converter that receives an output voltage from the low frequency amplifier and converts the output voltage to a digital signal.

2. The sensor electrical circuit of claim 1 wherein a magnetic bias coil is wrapped around the GMI fiber wherein the magnetic bias coil increases the sensitivity of the GMI fiber by fixing an operating point for the GMI fiber.

3. The sensor electrical circuit of claim 1 wherein the decoupling network further comprises:
   a first inductor that acts as a short circuit of direct current, while cutting off the radio frequency excitation from the low frequency amplifier; and
   a second capacitor.

4. The sensor electrical circuit of claim 1 wherein said low frequency amplifier is a rail to rail bi-polar operational amplifier.

5. The sensor electrical circuit of claim 1 wherein the second resistor is also used to bias the correct square wave excitation level across the GMI fiber.

6. The sensor electrical circuit of claim 1 wherein the output voltage of the amplifier with no applied magnetic field is expressed as Vref * (gain), where Vref represents the voltage in volts of the stable voltage reference, and the gain is calculated according to the equation 1+(R1/direct current GMI fiber F1 resistance) where R1 is the resistance in Ohms of the first resistor.

7. The sensor electrical circuit of claim 1 wherein the GMI fiber is synthesized to have a mainly resistive change under an applied magnetic field for a given excitation frequency.

* * * * *